United States Patent [19]

Vider

[11] Patent Number: 4,954,990
[45] Date of Patent: Sep. 4, 1990

[54] PROGRAMMING VOLTAGE CONTROL CIRCUIT FOR EPROMS

[75] Inventor: Dov-Ami Vider, Sunnyvale, Calif.

[73] Assignee: Cypress Semiconductor Corp., San Jose, Calif.

[21] Appl. No.: 358,558

[22] Filed: May 30, 1989

[51] Int. Cl.$^5$ ............................................. G11C 11/40
[52] U.S. Cl. ................................. 365/185; 365/189.01
[58] Field of Search ............ 365/63, 182, 185, 180.01, 365/230.01

[56] References Cited

U.S. PATENT DOCUMENTS 4,791,607 12/1988 Igarashi et al. ...................... 365/185

Primary Examiner—Terrell W. Fears
Attorney, Agent, or Firm—Roger S. Borovoy

[57] ABSTRACT

Apparatus for controlling the programming voltage of an EPROM array composed of a plurality of programmable floating gate MOS cells, which includes an additional floating gate MOS cell fabricated on the same chip and in the same manner as the array of cells, the additional cell not being connected for programming during the normal programming of the array. A voltage is applied to the additional cell to generate a drain current through the cell. A feedback control is connected between the source of external programming voltage for the array and the actual voltage within the array used for programming the cells, the feedback control using the amplitude of the drain current in the additional cell to control the magnitude of the actual programming voltage in the array in such a manner that when the drain current of the additional cell increases, the programming voltage decreases proportionately. The drain current in the additional cell can also be used for compensating for variations in the fixed programming voltage.

6 Claims, 1 Drawing Sheet

PROGRAMMING VOLTAGE CONTROL CIRCUIT FOR EPROMS

BACKGROUND OF THE INVENTION

This invention is the field of floating gate erasable programmable read-only memories (EPROMs). EPROMs are an array of floating gate MOS devices which retain their data according to the existance or absence of a charge on their floating gate. A floating gate array is programmed electrically. A programming voltage, $V_{PGM}$, is applied to its control gate and the drain, the consequence of which is to store charge on the floating gate.

The amplitude of this programming voltage $V_{PGM}$ applied to the drain of the cell needs to be accurately controlled. For reliable programming, it must be a value approximately between the avalanche breakdown voltage of the floating gate device on the high side, and the programming breakdown voltage of the cell on the low side. If $V_{PGM}$ is too high, the device can be destroyed during programming; if it is too low, the cells will not properly be programmed.

An external programming voltage $V_{PP}$, is usually applied through one pin of the package containing the array. In many systems applications, this external voltage $V_{PP}$ may vary. Occasionally these $V_{PP}$ variations can be severe enough to cause programming errors or, worse yet, destroy the array through the mechanisms discussed above. If the actual cell programming voltage $V_{PGm}$ which reaches the gate of the floating gate transistor to be programmed rises above its avalanche breakdown, the cell may be damaged or destroyed. If $V_{PGM}$ drops below the programming voltage, a programming error is caused. It is highly desirable for the floating gate array circuit to be essentially insensitve to variations in $V_{PP}$.

Furthermore, as is well known in the art, EPROM arrays are manufactured using a complex wafer fabrication manufacturing process. Small process variations can cause sufficient differences in the resulting EPROM cells to necessitate changes in their required programming voltage. For example, if in the process of making the wafer, the EPROMs turn out to draw more current at a given voltage than was planned for, a lower programming voltage will be sufficient to program them. Unless $V_{PP}$ is adjusted for these process variations, improper programming can occur.

BRIEF DESCRIPTION OF THE INVENTION

This invention provides an apparatus for accurately controlling the actual programming voltage, $V_{PGM}$, of an EPROM array. In accordance with one aspect of the invention, the circuit of the invention compensates for variations in the applied programming voltage $V_{PP}$. Irrespective of such changes in the predetermined incoming voltage, $V_{PP}$, the voltage, $V_{PGM}$, actually applied for programming the EPROM cells of the array remains constant.

In accordancee with a second aspect of the invention, the programming voltage $V_{PGM}$ for the EPROM cells is adjusted to compensate for changes in charging current of the EPROMs of the array resulting either from changes in ambient conditions, such as temperature, or from changes resulting from the processing of the EPROM wafers. The circuit of the invention provides the desired programming voltage $V_{PGM}$ for the EPROMs irrespective of any or all of these conditions.

Briefly, the apparatus of the invention for controlling the programming voltage of an EPROM array includes an additional, non-programmed floating gate MOS EPROM cell frabricated on the sam chip in the same manner as the array of programmable floating gate cells. This additional cell is not connected for programming during normal programming of the array. A voltage is applied to this additional cell in order to generate a drain current through it. A feedback circuit is coupled to the point in the array which is used as a source of programming voltage $V_{PGM}$ for the EPROMs of the array. The amplitude of the drain current in the additional EPROM cell is used to control the magnitude of this programming voltage in such a manner that when the drain current of the additional cell increases, the programming voltage $V_{PGM}$ proportionately decreases.

Since this additional EPROM cell was fabricated using the same dimensional and processing parameters as the floating gate EPROM cells of the array, any changes in these parameters will affect the drain current of the additional cell in the same way as they affect the charging current in the drains of the EPROM array cells. Thus, the circuit of the invention provides a built-in compensation for the effects of these changes.

In addition, the invention provides a means for coupling the external predetermined programming voltage $V_{PP}$ for the array to the additional cell. As thus coupled, this external programming voltage $V_{PP}$ generates a drain current through the additional cell which varies in accordance with variations in the applied voltage $V_{PP}$. Accordingly, this same drain current of the additional cell, which is coupled to the source of programming voltage $V_{PGM}$ of the array, compensates for changes in $V_{PP}$ and keeps the actual programming voltage for the array, $V_{PGM}$, which is derived from $V_{PP}$, at a substantially constant level.

The invention will be beter understood from the more detailed description which follows, making reference to the drawings in which the single FIG. 1 is a circuit schematic of the programming circuit of the invention.

DETAILED DESCRIPTION OF THE INVENTION

Figure 1:
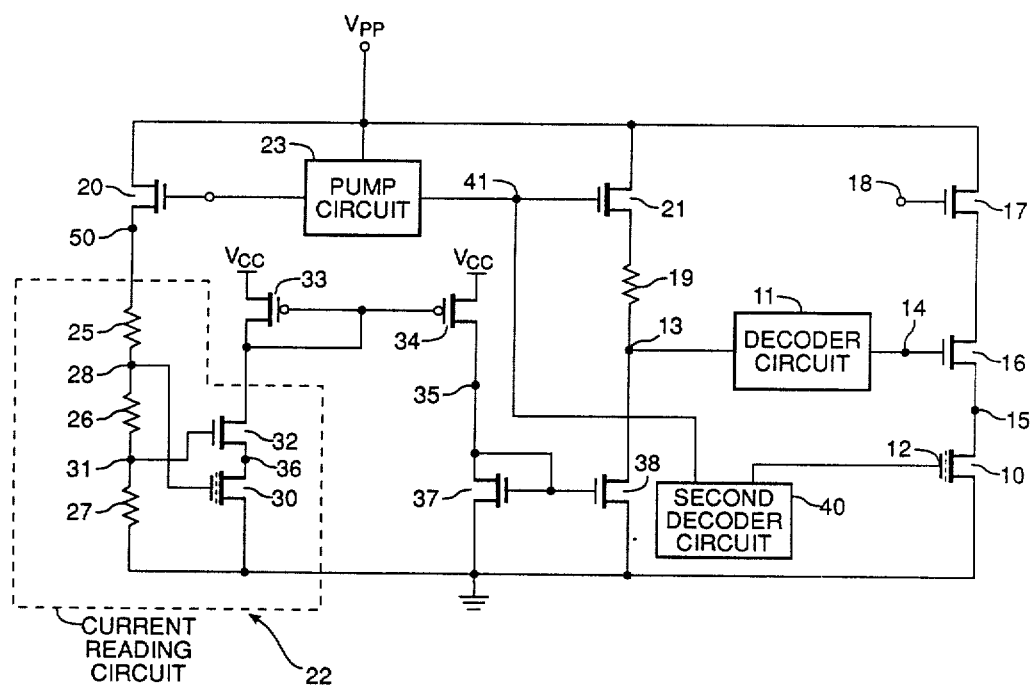
FIG. 1 is a schematic circuit diagram of the programming circuit of the invention.

FIG. 1 represents a programming circuit for programming floating gate EPROMs. Only one representative EPROM cell 10 of the array is shown in FIG. 1. However, it will be understood by those skilled in the art that a typical EPROM array may contain 512,000, 1,000,000 or more EPROM cells on a single chip. EPROM arrays are programmed using a conventional PROM programmer connected through the external pins of the chip package, as is well known in the art. Each EPROM cell is programmed with a "one" or a "zero", as desired, depending upon whether the floating gate has a stored charge or not. Convention and the type of cell employed determine which condition represents a one and which represents a zero.

The particular EPROM cell to be programmed is selected using two decoder circuits 11 and 40. the drain programming voltage $V_{PGM}$, which will be applied to the drain 15 of EPROM cell 10 if cell 10 has been selected by decoder circuits 11 and 40, appears across programming terminals 13 and 14 of decoder circuit 11. Transistor 16 is part of address decoder 11. This transistor is used to select the proper memory cell (in this example, cell 10) to be programmed when that memory cell 10 has been selected by a selection signals from decoders circuit 11 and 40. Decoder circuit 11 selected either the x-address or the y-address of the selected cell. The second decoder circuit 40 selects the other x or y address. Both decoders together determine the unique selected cell. When decoder circuit 40 has selected cell 10, for example, a pumped voltage $V_{PP}$ is connected from node 41 to the gate 12 of cell 10 to program it. For programming, cell 10 must have been selected by both decoder circuit 11 to have its programming drain current and by decoder circuit 40 to have its necessary programming gate voltage. Programming voltage $V_{PGM}$ causes current to flow in the drain circuit of cell 10. $V_{PGM}$ must be constant and its value approximately centered between the avalanche breakdown voltage of cell 10 on the high side, and the programming breakdown voltage of cell 10 on the low side. $V_{PGM}$ is derived, as will be explained below, from $V_{PP}$. Resistor 19, the voltage setting resistor, provides the desired voltage drop between $V_{PP}$ and $V_{PGM}$. The drain terminal 15 of EPROM cell 10 is coupled in series with programming MOS transistors 16 and 17. Whether the chosen memory cell 10 is to be programmed with a one or with a zero is determined by the voltage at gate terminal 18 of data decoder MOS transistor 17.

In a preferred embodiment of the invention, a pair of pumping MOS transistors 20 and 21 are employed to ensure that the full value of $V_{PP}$ is transferred to the current reading circuit 22. Assuming, for example, that the nominal $V_{PP}$ is twelve volts, a detector in pump circuit 23 detects the presence of this twelve volt valve. When $V_{PP}$ is present, pump circuit 23 knows that the EPROM array is being programmed. Circuit 23 then turns on the gates of pumping transistors 20 and 21, which in turn enables the full predetermined programming voltage $V_{PP}$ to be transmitted to the current reading circuit 22 through terminal 40 without a voltage drop. This enables current reading circuit 22 to sense $V_{PP}$ very accurately.

Resistors 25, 26 and 27 in current reading circuit 22 form a conventional voltage divider. Node 28 between resistors 25 and 26 is couple dto the gate of the additional EPROM cell 30. EPROM cell 30 is formed in the processing of the semiconductor wafer of the EPROM array using exactly the same processing steps and geometries used for all of the normal, programmable EPROM cells, such as cell 10. However, to operate in accordance with this invention, cell 30 must be connected in the circuit so as not to be programmable during normal programming of the array. This is accomplished by selecting the values of resistors 25 and 26 in current reading circuit 22 so that the voltage at node 36, coupled to the drain of the additional, non-programmed EPROM cell 30, is such that cell 30 is always operated in the linear region. To keep the cell in that region, the drain voltage must remain below the gate voltage. This is accomplished by control of the voltage at the tap 31 between resistors 26 and 27 which in turn controls the drain voltage of cell 30. This drain voltage also is limited by MOS transistor 32, connected in series with the drain of EPROM cell 30, so that the drain voltage will remain constant irrespective of minor changes in the supply voltage $V_{CC}$. $V_{CC}$ is coupled through MOS transistor 33 to the drain of the controlling MOS transistor 32. The ability of the circuit of the invention to operate satisfactorily even with variations in supply voltage is another significant benefit.

MOS transistors 33 and 34 together form a current mirror. As shown, these are P-channel MOS devices (as opposed to the rest of the MOS devices in the circuit of this invention, which ar N-channel). The gates of MOS transistors 33 and 34 are coupled together, as shown, and the gate of transistor 33 is coupled to its drain, as shown. The sources of these transistors are coupled to $V_{CC}$. The current at drain terminal 35 of MOS transistor 34 is a "reflection" of the drain current at terminal 36 from the additional EPROM cell 30.

N-channel transistors 37 and 38 also are connected to form a current mirror. Again the drain of transistor 37 is connected to its gate, as shown. The current at drain terminal 13 of transistor 38 mirrors the current at terminal 35 connected to the drain and gate of transistor 37.

In operation of the circuit of the invention, the actual drain current in additional EPROM cell 30 is very low. Accordingly, the use of the two current mirror circuits enables precise control of the programming voltage $V_{PGM}$ at terminal 13 during operation of the circuit in spite of the very low drain current from the addition EPROM cell 30.

In operation, the circuit of this invention controls the programming voltage $V_{PGM}$ between terminals 13 and 14 so that it is substantially independent of shifts in $V_{PP}$. Any shift in $V_{PP}$ is directly passed by pump circuit 23 to the input terminal 50 of current reading circuit 22. By the operation of resistors 25, 26 and 27 and transistor 32, as discussed above, this shift in $V_{PP}$ is applied to the gate and drain terminals of additional EPROM 30, causing a corresponding and proportional shift in the drain current at terminal 36. This changed drain current is then passed through transistor 32, through the first current mirror circuit comprising transistors 33 and 34, and on through the second current mirror circuit comprising transistors 37 and 38, to adjust the programming voltage $V_{PGM}$ applied to decoder circuit 11. Because of this arrangement of the current mirror circuits, the shift in $V_{PGM}$ is inversely proportional to the shift of $V_{PP}$ which caused it. Accordingly, should $V_{PP}$ drop slightly, the change in the drain current of additional EPROM 30 results in a compensating change in the voltage $V_{PGM}$ across decoder circuit 11, causing $V_{PGM}$ to remain constant.

In addition, the circuit of this invention also compensates for any changes in the required programming drain current of the EPROM cells of the array resulting from misprocessing or processing shifts of the floating gate EPROM devices of the array. Additional EPROM cell 30 is a duplicate of the programmable EPROM cells of the array, a representative one of which is EPROM cell 10. Thus, if a slight misprocessing in the array cells causes the application of a proper programming voltage to result in the charging drain current of an array cell being programmed to be slightly too low for satisfactory programming, this same low drain current also will appear at the drain 36 of additional EPROM cell 30. The low drain current at terminal 36 is translated through transistor 32 and current mirrors 33, 34 and 37, 38 to adjust the programming voltage $V_{PGM}$ across decoder circuit 11 to compensate for the decreased charging drain current. After $V_{PGM}$ is thus compensated, in this example increased, the resulting drain current from $V_{PGM}$ will become exactly the needed drain current to program cell 10 in spite of this slight misprocessing.

This compensation works in the same way in the event of ambient temperature changes. Such changes will affect the drain current of additional EPROM cell 30 exactly the same way as it affects the drain current of the programmable EPROM cells of the array, such as cell 10. Thus, the actual programming voltage $V_{PGM}$ will be adjusted for the temperature-related shift of the drain current in additional EPROM cell 30, resulting in a lower or higher $V_{PGM}$ across decoder circuit 11, as required in view of the temperature-related change in drain current of cell 10.

In summary, an increase in current at the drain of additional EPROM cell 30 results in a lower programming voltage $V_{PGM}$ across decoder circuit 11. A decrease in drain current has the opposite effect. In EPROMs, it is well known that the more current an EPROM cell can draw (which is determined by its geometry and processing), the less programming voltage which is required to program it. The circuit of this invention assures that the proper programming voltage $V_{PGM}$ is always applied to the array cells in spite of processing variations in the wafer or temperature changes during programming.

As is well known to those skilled in the art, many changes may be made in the circuitry described above in connection with the preferred embodiment of FIG. 1 without departing from the spirit and scope of the invention. Accordingly, the only limitations on this invention are those set forth in the claims which follow.

I claim:

1. Apparatus for controlling the programming voltage of an EPROM array having a plurality of programmable floating gate MOS cells, comprising:

an additional floating gate MOS cell fabricated on the same chip in the same manner as said plurality of programmable floating gate cells, said additional cell not being connected for programming during normal programming of said array;

means for applying a voltage to said additional cell in order to generate a drain current through said additional cell;

feedback means coupled to a source of programming voltage for said array which uses the amplitude of said drain current in said additional cell to control the magnitude of said programming voltage in such a manner that when said drain current increases, said programming voltage proportionately decreases.

2. The apparatus for controlling the programming voltage of an EPROM array of claim 1 further characterized by said feedback means including a current mirror circuit whose input is said drain current, said current mirror circuit coupling said additional cell to said source of programming voltage for said array.

3. Apparatus for controlling the programming voltage of an EPROM array having a plurality of programmable floating gate cells, comprising:

an additional floating gate MOS cell fabricated on the same chip in the same manner as said plurality of programmable floating gate MOS cells, said additional cell not being connected for programming during normal programming of said array;

a means for providing a predetermined voltage to said array, said predetermined voltage tending to vary somewhat with changes in ambient and processing conditions;

means for coupling said predetermined voltage to said additional cell in order to generate a drain current through said additional cell, said drain current varying in accordance with the variations in said predetermined voltage; and feedback means coupling said additional cell to a source of programming voltage for said array, said feedback means using the amplitude of said drain current in said additional cell to control said programming voltage for said array in such a manner that when said predetermined voltage changes, said programming voltage remains substantially constant.

4. The apparatus for controlling the programming voltage of an EPROM array of claim 3 further characterized by said means for coupling said predetermined voltage to said additional cell being a set of series-coupled resistors coupled between the gate or drain of said additional cell and said means for providing said predetermined voltage.

5. The apparatus for controlling the programming voltage of an EPROM array of claim 3 further characterized by said feedback means including a current mirror circuit whose input is said drain current, said current mirror circuit coupling said additional cell to said source of programming voltage for said array.

6. The apparatus for controlling the programming voltage of an EPROM array of claim 4 further characterized by said feedback means including a current mirror circuit whose input is said drain current, said current mirror circuit coupling said additional cell to said source of programming voltage for said array.

* * * * *